US007924073B2

(12) United States Patent
Park

(10) Patent No.: US 7,924,073 B2
(45) Date of Patent: Apr. 12, 2011

(54) SEMICONDUCTOR MEMORY DEVICE HAVING BACK-BIAS VOLTAGE IN STABLE RANGE

(75) Inventor: Jae-Boum Park, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 99 days.

(21) Appl. No.: 12/165,040

(22) Filed: Jun. 30, 2008

(65) Prior Publication Data

US 2009/0167425 A1 Jul. 2, 2009

(30) Foreign Application Priority Data

Dec. 27, 2007 (KR) ........................ 10-2007-0138961

(51) Int. Cl.
*H03L 7/06* (2006.01)

(52) U.S. Cl. ........................................ 327/157; 327/536

(58) Field of Classification Search .................. 327/157, 327/148, 536–538
See application file for complete search history.

(56) References Cited

U.S. PATENT DOCUMENTS 6,016,072 A * 1/2000 Ternullo et al. ............... 327/535
7,397,282 B2 * 7/2008 Mizuno et al. .................. 326/81
2008/0150505 A1 * 6/2008 Abe .............................. 323/282

FOREIGN PATENT DOCUMENTS

KR 1020040006730 A 1/2004
KR 1020040051743 A 6/2004
KR 1020070030557 A 3/2007
KR 1020070101911 A 10/2007

OTHER PUBLICATIONS

Notice of Prelimary Rejection issued from Korean Intellectual Property Office on Apr. 28, 2009 with an English Translation.
Notice of Allowance issued from Korean Intellectual Property Office on Aug. 7, 2009 with an English Translation.

* cited by examiner

*Primary Examiner* — Lincoln Donovan
*Assistant Examiner* — Diana J Cheng
(74) *Attorney, Agent, or Firm* — IP & T Group LLP

(57) ABSTRACT

A back-bias voltage generating circuit controls the back-bias voltage in a predetermined range by detecting the back-bias voltage in case the back-bias voltage level decreases below a predetermined target level. The circuit includes first and second detecting units outputting respective detection signals, which detect a voltage level of the terminal based on respective higher first and lower second target levels. An oscillator generates an oscillation signal that oscillates at a predetermined frequency, in response to a detection signal of the first voltage detecting unit. A charge pumping unit drives the terminal by performing charge pumping in response to the oscillation signal. A voltage level control unit controls the voltage level of the terminal in response to the detection signals, whereby the terminal's voltage level is lower than the first target level and higher than the second target level.

17 Claims, 2 Drawing Sheets

SEMICONDUCTOR MEMORY DEVICE HAVING BACK-BIAS VOLTAGE IN STABLE RANGE

CROSS-REFERENCE TO RELATED APPLICATION

The present application claims priority to Korean application number 10-2007-0138961, filed on Dec. 27, 2007, which is incorporated by reference in its entirety.

BACKGROUND OF THE INVENTION

The present invention relates to a semiconductor design technology and, more particularly to a back-bias voltage generating circuit of the semiconductor device. Particularly, the invention relates to a back-bias voltage generating circuit capable of stable operation by controlling the level of a back-bias voltage to be within a predetermined range.

Most semiconductor devices headed by a dynamic random access memory (DRAM) internally provides a plurality of internal voltages, which are required to operate internal circuits in a chip, by using an internal voltage generator. The internal voltage generator generates a plurality of internal voltage signals with a plurality of voltage levels using power supply voltage (VDD) and ground voltage VSS from an external circuit.

Generally, the generation of a plurality of internal voltages includes processes to produce a reference voltage signal having a reference voltage level and to produce the internal voltage using a charge pumping or down-converting technique based on the reference voltage signal.

Here, typical internal voltages, which are generated by the charge pumping technique, are a boosted voltage VPP and a back-bias voltage VBB, and a typical internal voltage, which is generated by the down-converting technique, is a core voltage VCORE.

The core voltage VCORE is lower than the external power supply voltage VDD and is higher than a ground voltage VSS. This voltage is required to reduce power consumption in maintaining the voltage level of data, which are stored in memory cells, and to maintain a stable operation of cell transistors.

The boosted voltage VPP is higher than the external power supply voltage VDD. This voltage is required to be supplied to a word line that is connected to a gate of a cell transistor when a memory cell is accessed. This boosted voltage VPP prevents the cell data loss that is caused by the threshold voltage (Vth) of a cell transistor.

Also, the back-bias voltage VBB is lower than the external ground voltage VSS. The back-bias voltage VBB reduces the variation of the threshold voltage Vth of the cell transistor, which is caused by the body effect. Accordingly, the back-bias voltage VBB increases the stabilization of the cell transistor and reduces a channel leakage current generated in the cell transistor.

Of the internal voltages of the semiconductor device, i.e., the boosted voltage, the back-bias voltage VBB and the core voltage VCORE, the generation of the back-bias voltage VBB will be described briefly based on the charge pumping technique.

FIG. 1 is a block diagram illustrating a back-bias voltage generator of a conventional semiconductor memory device.

Referring to FIG. 1, the back-bias voltage generator includes a back-bias voltage detector 100, an oscillator 120, and a back-bias charge pump 140. The back-bias voltage detector 100 detects a back-bias voltage based on a predetermined target level. The oscillator 120 produces an oscillation signal VBB_OSC at a predetermined frequency in response to an detection signal VBB_DET of the back-bias voltage detector 100. The back-bias charge pump 140 drives a back-bias voltage output terminal by performing a charge pumping operation in response to the oscillation signal VBB_OSC of the oscillator 120.

In the conventional back-bias voltage generator of FIG. 1, the back-bias voltage detector 100 activates and outputs the detection signal VBB_DET when the voltage level at the back-bias voltage output terminal is higher than a predetermined target level (typically, −0.8V). On the contrary, when the voltage level at the back-bias voltage output terminal is lower than the predetermined target level, the back-bias voltage detector 100 deactivates the detection signal VBB_DET.

At this time, when the detection signal VBB_DET is activated, the oscillator 120 oscillates and outputs the oscillation signal VBB_OSC at a predetermined frequency. When the detection signal VBB_DET is deactivated, the oscillator 120 fixes the oscillation signal VBB_OSC to a predetermined logic level, for example, to a logic low or high level.

Furthermore, when the oscillation signal VBB_OSC which is oscillated at the predetermined frequency is inputted, the back-bias charge pump 140 conducts the voltage drop at the back-bias voltage output terminal by driving the back-bias voltage output terminal. That is, the back-bias charge pump 140 controls the back-bias voltage output terminal in order that the voltage level at the back-bias voltage output terminal is lower than the predetermined target level. On the contrary, when the oscillation signal VBB_OSC that is fixed to the predetermined logic level is inputted, the driving operation of the back-bias voltage output terminal is not carried out at back-bias charge pump 140. That is, the driving operation of the back-bias voltage output terminal is not carried out until the voltage level of the back-bias voltage output terminal is higher than the predetermined target level due to an operation of the semiconductor memory device.

As mentioned above, the semiconductor memory device produces the back-bias voltage VBB. However, the conventional back-bias voltage generator uses a method for producing the back-bias voltage VBB with a predetermined driving force, regardless of an operating mode of the semiconductor memory device, i.e., an active mode or a standby mode.

Accordingly, the driving force of the back-bias charge pump 140 is determined based on the active mode of the semiconductor memory device that makes relatively much use of the back-bias voltage VBB. That is, when the semiconductor memory device operates in the active mode, the voltage level of the back-bias voltage output terminal swings in a range of a predetermined target level.

However, when the semiconductor memory device operates in the standby mode, the usage of the back-bias voltage VBB is decreased. Accordingly, the voltage level of the back-bias voltage output terminal is much out of the predetermined target level so that there is a problem in that the voltage level is too low, because the back-bias charge pump 140 still has the driving force for the active.

If the voltage level of the back-bias voltage output terminal is much out of the predetermined target level so that the voltage level is too low continuously, the channel leakage current generated in the cell transistor of the semiconductor memory device is increased, far from being decreased. That is, there is a problem with the cell retention time, which indicates the time to maintain the data without further supplying current, to be decreased.

SUMMARY OF THE INVENTION

The present invention is directed to providing a back-bias voltage generating circuit capable of controlling the back-bias voltage in a predetermined range by detecting the back-bias voltage in case that the back-bias voltage level is decreased below a predetermined target level.

In accordance with an aspect of the invention, there is provided a semiconductor memory device, which includes a first voltage detecting unit configured to detect a voltage level of a back-bias voltage terminal based on a first target level to output a first detection signal, a second voltage detecting unit configured to detect the voltage level of the back-bias voltage terminal based on a second target level to output a second detection signal, wherein the second target level is lower than the first target level, an oscillator configured to generate an oscillation signal, which is oscillated at a predetermined frequency, in response to the first detection signal, a charge pumping unit configured to drive a terminal for the back-bias voltage by performing a charge pumping operation in response to the oscillation signal, and a voltage level control unit configured to control the back-bias voltage in between the first target level and the second target level in response to the first detection signal and the second detection signal.

In accordance with an aspect of the invention, there is provided a method of driving a semiconductor device, which includes generating a first detection signal by detecting a voltage level of a back-bias voltage based on a first target level, generating a second detection signal by detecting the voltage level of the back-bias voltage based on a second target level, wherein the second target level is lower than the first target level, driving a terminal for the back-bias voltage at the first target level in response to the first detection signal, and controlling the voltage level of the back-bias voltage to be lower than the first target level and higher than the second target level in response to the first and second detection signals.

In the invention, in case that the back-bias voltage level is decreased below a predetermined target level, such a voltage drop is detected and the dropped back-bias voltage level is compulsively increased to a predetermined target level. Therefore, the back-bias voltage level is maintained in a range of a predetermined voltage level. That is, the back-bias voltage level is varied in a stable range so that a semiconductor memory device is not influenced by the variation of the back-bias voltage level.

As a result, the semiconductor memory device according to the invention can minimize the channel leakage current generated in a cell transistor, regardless of an active mode or standby mode. Accordingly, the cell retention time of the semiconductor memory device is maximized.

DETAILED DESCRIPTION OF THE PREFERRED EMBODIMENTS

Hereinafter, the present invention will be described in detail through embodiments with reference to the accompanying drawings. The embodiments are just for exemplifying the invention, and they do not limit the scope of right to be protected.

Figure 1:
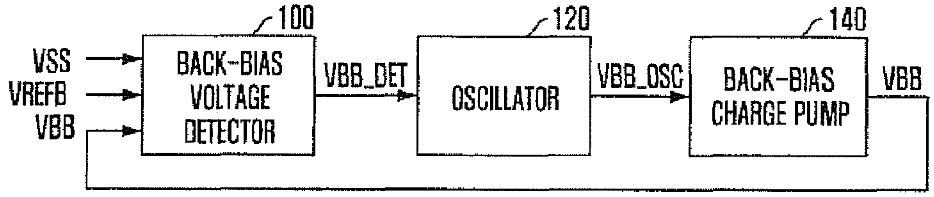
FIG. 1 (PRIOR ART)
FIG. 1 is a block diagram illustrating a back-bias voltage generator of a conventional semiconductor memory device.
Figure 2:
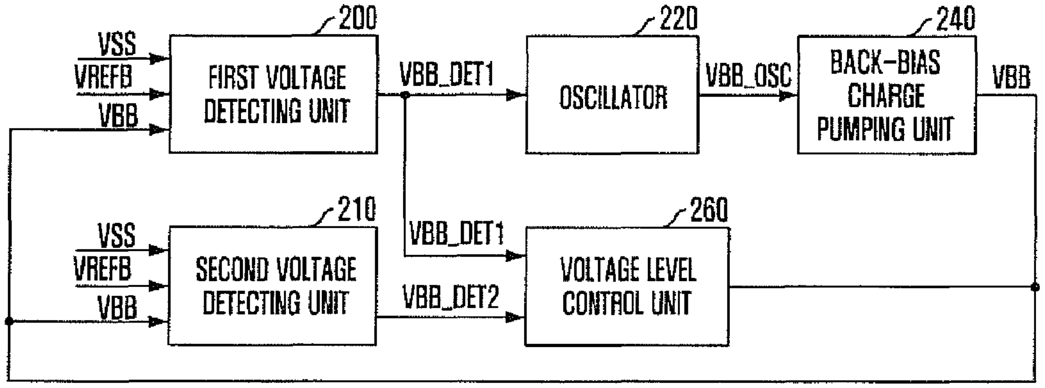
FIG. 2 is a block diagram illustrating a back-bias voltage generating circuit in accordance with an embodiment of the present invention.

FIG. 2 is a block diagram illustrating a back-bias voltage generating circuit in accordance with an embodiment of the invention. Referring to FIG. 2, the back-bias voltage generating circuit according to the invention includes a first voltage detecting unit 200, a second voltage detecting unit, an oscillator 220, a back-bias charge pumping unit 240, and a voltage level control unit 260.

The first voltage detecting unit 200 detects a level of a back-bias voltage VBB based on a first target level. The second voltage detecting unit 210 detects the level of the back-bias voltage VBB based on a second target level which is lower than the first target level. The oscillator 220 produces an oscillation signal VBB_OSC at a predetermined frequency in response to a first detection signal VBB_DET1 of the first voltage detecting unit 200. The back-bias charge pumping unit 240 drives a back-bias voltage output terminal by performing a charge pumping operation in response to the oscillation signal VBB_OSC of the oscillator 220. The voltage level control unit 260 controls the back-bias voltage VBB in response to the first detection signal VBB_DET1 of the first voltage detecting unit 200 and a second detection signal VBB_DET2 of the second back-bias voltage detector 220 in order that the voltage level of the back-bias voltage VBB is lower than the first target level and is higher than the second target level.

The first voltage detecting unit 200 activates and outputs the first detection signal VBB_DET1 when the voltage level of the back-bias voltage VBB is higher than the first target level (conventional back-bias voltage of −0.8V). On the contrary, when the voltage level of the back-bias voltage VBB is lower than the first target level, the first voltage detecting unit 200 deactivates the first detection signal VBB_DET1.

The second voltage detecting unit 210 activates and outputs the second detection signal VBB_DET2 when the voltage level of the back-bias voltage VBB is higher than the second target level, which is lower than a conventional back-bias voltage level or the first target level, e.g., −1.0. On the contrary, when the voltage level of the back-bias voltage VBB is lower than the second target level, the second voltage detecting unit 210 deactivates the second detection signal VBB_DET2.

At this time, when the first detection signal VBB_DET1 is activated, the oscillator 220 oscillates and outputs the oscillation signal VBB_OSC at the predetermined frequency. When the first detection signal VBB_DET1 is deactivated, the oscillator 220 fixes the oscillation signal VBB_OSC to a predetermined logic level, for example, to a logic low or high level.

Furthermore, when the oscillation signal VBB_OSC that is oscillated at the predetermined frequency is inputted, the back-bias charge pumping unit 240 conducts the voltage drop at a back-bias voltage output terminal by driving the back-bias voltage output terminal. That is, the back-bias charge pumping unit 240 controls the back-bias voltage VBB in order that the voltage level of the back-bias voltage VBB is lower than the first target level. On the contrary, when the oscillation signal VBB_OSC that is fixed to the predetermined logic level is inputted, the driving operation of the back-bias voltage output terminal is not carried out at back-bias charge pumping unit 240. That is, the driving operation of the back-bias voltage output terminal is not carried out until the voltage level of the back-bias voltage VBB is higher than the first target level due to an operation of the semiconductor memory device.

In the operations of the oscillator 220 and the back-bias charge pumping unit 240, the back-bias voltage output terminal is driven in order that the voltage level of the back-bias voltage VBB has the first target level in response to first detection signal VBB_DET1.

Further, the voltage level control unit 260 maintains the voltage level of the back-bias voltage VBB to be lower than the first target level in response to the first detection signal VBB_DET1, and maintains the voltage level of the back-bias voltage VBB to be higher than the second target level in response to the second detection signal VBB_DET2.

Accordingly, in the semiconductor memory device according to the invention, the back-bias voltage generating circuit maintains the voltage level of the back-bias voltage VBB between the first and second target levels.

Figure 3:
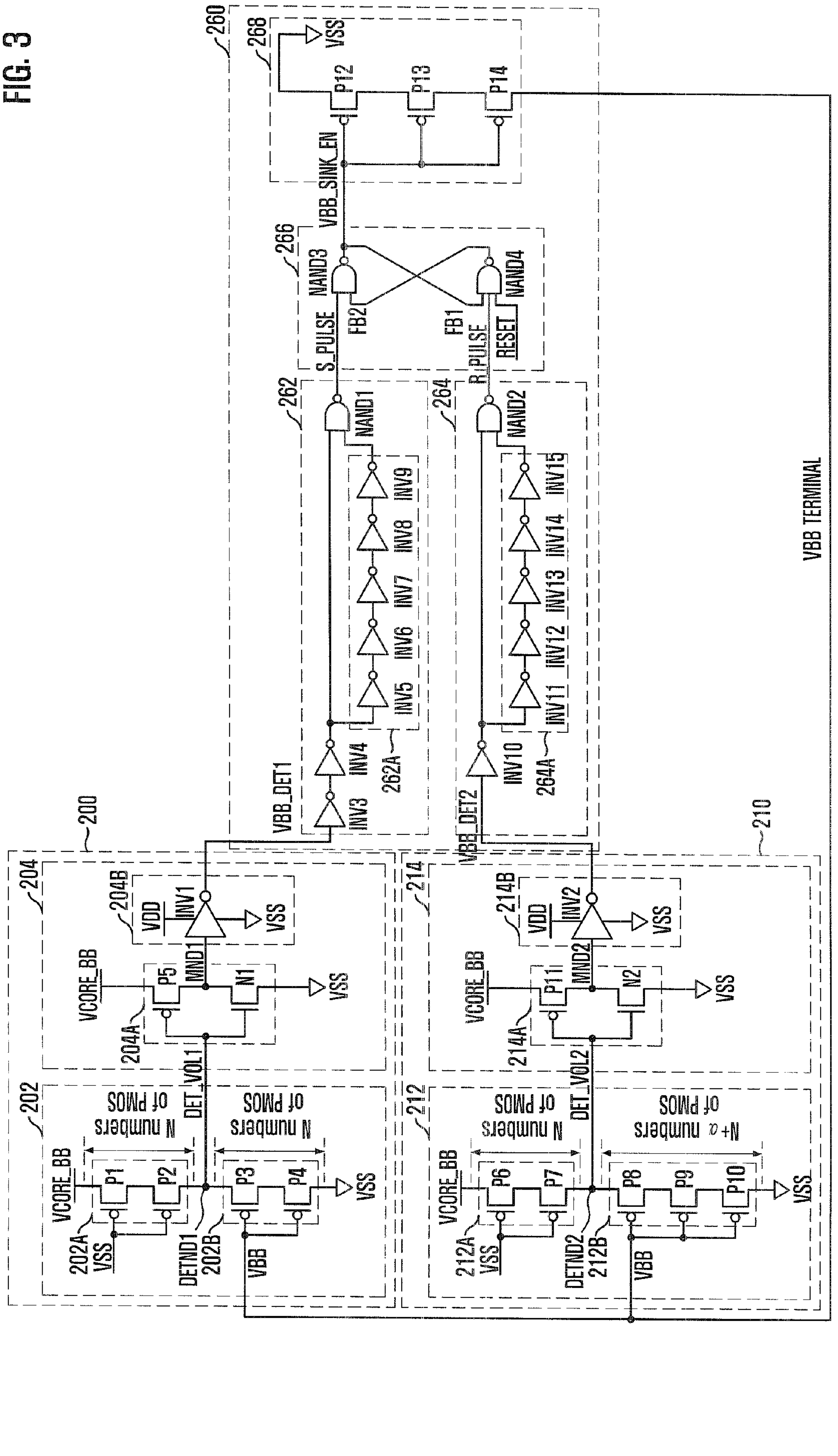
FIG. 3 is a circuit diagram illustrating first and second voltage detecting units and a voltage level control unit of FIG. 2.

FIG. 3 is a circuit diagram illustrating the first and second voltage detecting units 200 and 210, and the voltage level control unit 260 of FIG. 2. Referring to FIG. 3, the first voltage detecting unit 200 includes a first level detecting unit 202 and a first level changing unit 204. The first level detecting unit 202 outputs a first detection voltage DET_VOL1 which is analogously fluctuated according to the voltage level of the back-bias voltage VBB and has the small range of fluctuation in voltage. The first level changing unit 204 receives the first detection voltage DET_VOL1 and then outputs the first detection signal VBB_DET1 which fluctuates based on a predetermined logic level.

The first level detecting unit 202 includes a first resistor 202A and a second resistor 202B. The first resistor 202A, which is connected between a flat voltage terminal (VCORE_BB) and a detection node (DETND1), has a resistance value corresponding to a ground voltage VSS. The second resistor 202B, which is connected between the detection node (DETND1) and the ground voltage terminal (VSS), has a variable resistance value based on the variation of the back-bias voltage VBB with relatively little resistance fluctuation.

The first resistor 202A of the first level detecting unit 202 includes first and second PMOS transistors P1 and P2, which are connected in series between the flat voltage terminal (VCORE_BB) and the detection node (DETND1). The first PMOS transistor P1 controls the amount of current flowing from the flat voltage terminal (VCORE_BB) to a source of the second PMOS transistor P2 in response to the level of the ground voltage VSS applied to a gate thereof. Also, the second PMOS transistor P2 controls the amount of current flowing from a drain of the first PMOS transistor P1 to the detection node (DETND1) in response to the level of the ground voltage VSS applied to a gate thereof.

At this time, the ground voltage VSS used in the semiconductor memory device can be considered as a reference voltage on all the internal voltage signals used in the semiconductor memory device. Accordingly, the change of the ground voltage VSS can be considered as the level change of all the internal voltage signals and this means that the level of the ground voltage VSS is not changed actually in the standpoint of the semiconductor memory device. Accordingly, the resistance of first resistor 202A of the first level detecting unit 202 has a predetermined constant value.

The second resistor 202B of the first level detecting unit 202 includes third and fourth PMOS transistors P3 and P4 which are connected in series between the detection node (DETND1) and the ground voltage terminal (VSS). The third PMOS transistors P3 controls the amount of current flowing from the detection node (DETND1) to a source of the fourth PMOS transistor P4 in response to the level of the back-bias voltage VBB applied to a gate thereof. Also, the fourth PMOS transistors P4 controls the amount of current flowing from a drain of the third PMOS transistor P3 to the ground voltage terminal (VSS) in response to the level of the back-bias voltage VBB applied to a gate thereof.

The resistance value of the second resistor 202B can be changed based on the size of the third and fourth PMOS transistors P3 and P4. That is, the more in size is the summation of the third and fourth PMOS transistors P3 and P4, the higher is the basic resistance value of the second resistor 202B. On the contrary, the smaller in size is the summation of the third and fourth PMOS transistors P3 and P4, the lower is the basic resistance value of the second resistor 202B.

As mentioned above, since the level of the back-bias voltage VBB fluctuates based on the operations of the semiconductor memory device, the resistance value of the second resistor 202B can be changed based on the level of the supplied back-bias voltage VBB. That is, the lower is the level of the supplied back-bias voltage VBB, the lower is the resistance of the second resistor 202B. On the contrary, the higher is the level of the supplied back-bias voltage VBB, the higher is the resistance of the second resistor 202B.

At this time, the fluctuation in the resistance of the second resistor 202B is changed based on the basic resistance value of the second resistor 202B.

For example, if the second resistor 202B has a relative high resistance because the total size of the third and fourth PMOS transistors P3 and P4 is relatively large, the fluctuation in the resistance of the second resistor 202B is relatively great according to the fluctuation of the level of the back-bias voltage VBB.

On the contrary, if the second resistor 202B has a relative low resistance because the total size of the third and fourth PMOS transistors P3 and P4 is relatively small, the fluctuation in the resistance of the second resistor 202B is relatively little according to the fluctuation of the level of the back-bias voltage VBB.

As described above, the voltage level fluctuation of the detection voltage DET_VOL1, which is outputted from the first level detecting unit 202, and the resistance value fluctuation of the second resistor 202B in the first level detecting unit 202 are relatively small; however, this is illustrated in view of the first level changing unit 204 corresponding to the first level detecting unit 202. This will be more illustrated after reviewing the configuration of the first level changing unit 204.

The first level changing unit 204 includes a first logic level discriminating unit 204A and a level shifting unit 204B. The first logic level discriminating unit 204A logically discriminates a level of the first detection voltage DET_VOL1 based on a predetermined logic level using a flat voltage VCORE_BB and a ground voltage VSS. The level shifting unit 204B receives an output signal of the first logic level discriminating unit 204A which swings between the flat voltage VCORE_BB and the ground voltage VSS and outputs a signal, as the first detection signal VBB_DET1, which swings between a power supply voltage VDD and the ground voltage VSS.

The first logic level discriminating unit 204A of the first level changing unit 204 includes a fifth PMOS transistor P5 and a first NMOS transistor N1 which are in series connected to each other between the flat voltage terminal (VCORE_BB) and the ground voltage terminal (VSS). The fifth PMOS transistor P5 controls the electrical connection of the flat voltage terminal (VCORE_BB) and a middle node (MND1) in response to the voltage level of the first detection signal DET_VOL1 which is applied to a gate thereof. The first NMOS transistor N1 controls the electrical connection of the middle node (MND1) and the ground voltage terminal (VSS) in response to the voltage level of the first detection signal DET_VOL1 which is applied to a gate thereof. That is, the fifth PMOS transistor P5 and the first NMOS transistor N1 function as an inverter between the flat voltage terminal (VCORE_BB) and the ground voltage terminal (VSS).

Meanwhile, the level shifting unit 204B of the first level changing unit 204 includes a first inverter INV1 which uses the power supply voltage VDD and the ground voltage VSS and has a structure similar to the first logic level discriminating unit 204A.

Referring to FIG. 3, the second voltage detecting unit 210 includes a second level detecting unit 212 and a second level changing unit 214. The second level detecting unit 212 outputs a second detection voltage DET_VOL2 which is analogously fluctuated according to the voltage level of the back-bias voltage VBB and has the large range of fluctuation in voltage. The second level changing unit 214 receives the second detection voltage DET_VOL2 and then outputs the second detection signal VBB_DET2 which fluctuates based on a predetermined logic level.

The second level detecting unit 212 includes a third resistor 212A and a fourth resistor 212B. The third resistor 212A, which is connected between the flat voltage terminal (VCORE_BB) and a detection node (DETND2) has a resistance value corresponding to the ground voltage VSS. The fourth resistor 212B, which is connected between the detection node (DETND2) and the ground voltage terminal (VSS), has a variable resistance value based on the variation of the back-bias voltage VBB with relatively small voltage level fluctuation.

The third resistor 212A of the second level detecting unit 212 includes sixth and seventh PMOS transistors P6 and P7 which are in series connected to each other between the flat voltage terminal (VCORE_BB) and the detection node (DETND2). The sixth PMOS transistors P6 controls the amount of current flowing from the flat voltage terminal (VCORE_BB) to a source of the seventh PMOS transistor P7 in response to the level of the ground voltage VSS applied to a gate thereof. Also, the seventh PMOS transistors P7 controls the amount of current flowing from a drain of the sixth PMOS transistor P6 to the detection node (DETND2) in response to the level of the ground voltage VSS applied to a gate thereof.

At this time, the ground voltage VSS used in the semiconductor memory device can be considered as a reference voltage on all the internal voltage signals used in the semiconductor memory device. Accordingly, the change of the ground voltage VSS can be considered as the level change of all the internal voltage signals and this means that the level of the ground voltage VSS is not changed actually in the standpoint of the semiconductor memory device. Accordingly, the third resistor 212A of the second level detecting unit 212 has a predetermined resistance in a constant value.

The fourth resistor 212B of the second level detecting unit 212 includes eighth to tenth PMOS transistors P8 to P10 which are in series connected to each other between the detection node (DETND2) and the ground voltage terminal (VSS). The eighth PMOS transistors P8 controls the amount of current flowing from the detection node (DETND2) to a source of the ninth PMOS transistor P9 in response to the level of the back-bias voltage VBB applied to a gate thereof. The ninth PMOS transistors P9 controls the amount of current flowing from a drain of the eighth PMOS transistors P8 to a source of the tenth PMOS transistor P10 in response to the level of the back-bias voltage VBB applied to a gate thereof. Also, the tenth PMOS transistors P10 controls the amount of current flowing from a drain of the ninth PMOS transistor P9 to the ground voltage terminal (VSS) in response to the level of the back-bias voltage VBB applied to a gate thereof.

The resistance value of the fourth resistor 212B can be changed based on the size of the eighth to tenth PMOS transistors P8 to P10. That is, the more in size is the summation of the eighth to tenth PMOS transistors P8 to P10, the higher is the basic resistance value of the fourth resistor 212B. On the contrary, the smaller in size is the summation of the eighth to tenth PMOS transistors P8 to P10, the lower is the basic resistance value of the fourth resistor 212B.

As mentioned above, since the level of the back-bias voltage VBB fluctuates based on the operations of the semiconductor memory device, the resistance value of the fourth resistor 212B can be changed based on the level of the supplied back-bias voltage VBB. That is, the lower is the level of the supplied back-bias voltage VBB, the lower is the resistance value of the fourth resistor 212B. On the contrary, the higher is the level of the supplied back-bias voltage VBB, the higher is the resistance value of the fourth resistor 212B.

At this time, the fluctuation in the resistance value of the fourth resistor 212B is changed based on the basic resistance value of the fourth resistor 212B.

For example, if the basic resistance value of the fourth resistor 212B is relatively large because the total size of the eighth to tenth PMOS transistors P8 to P10 is relatively large, the fluctuation in the resistance value of the fourth resistor 212B according to the fluctuation of the level of the back-bias voltage VBB is relatively large.

On the contrary, if the basic resistance value of the fourth resistor 212B is relatively low because the total size of the eighth to tenth PMOS transistors P8 to P10 is relatively small, the fluctuation in the resistance value of the second resistor 202B according to the fluctuation of the level of the back-bias voltage VBB is relatively small.

The first and second level detecting units 202 and 212 will be described in detail below.

First, assuming that the first to fourth and sixth to tenth PMOS transistors P1-P4 and P6-P10 have all the same size, the actual resistance value of the first resistor 202A in the first level detecting unit 202 is to be the same as that of the third resistor 212A in the second level detecting unit 212, because the number of the PMOS transistors P1 and P2 included in the first resistor 202A of the first level detecting unit 202 is the same as that of the PMOS transistors P6 and P7 included in the third resistor 212A of the second level detecting unit 212. That is, if the number of the PMOS transistors P6 and P7 included in the third resistor 212A of the second level detecting unit 212 is N, the number of the PMOS transistors P1 and P2 included in the first resistor 202A of the first level detecting unit 202 is also N. Accordingly, the basic resistance value of the third resistor 212A in the second level detecting unit 212 is apparently the same as that of the first resistor 202A in the first level detecting unit 202.

On the contrary, since the number of the PMOS transistors P3 and P4 included in the second resistor 202B of the first level detecting unit 202 is different from that of the PMOS transistors P8 to P10 included in the fourth resistor 212B of the second level detecting unit 212, the actual resistance value of the second resistor 202B in the first level detecting unit 202 is to be different from that of the fourth resistor 212B in the second level detecting unit 212. Further, if the number of PMOS transistors included in the fourth resistor 212B of the second level detecting unit 212 is N+$\alpha$, the basic resistance value of the fourth resistor 212B in the second level detecting unit 212 is apparently more than that of the second resistor 202B in the first level detecting unit 202 because the number of PMOS transistors included the second resistor 202B in the first level detecting unit 202 is N.

Accordingly, the resistance value fluctuation caused by the voltage level change of the back-bias voltage VBB is small in the second resistor 202B of the first level detecting unit 202 and is large in the fourth resistor 212B of the second level detecting unit 212.

That is, the voltage level fluctuation of the first detection voltage DET_VOL1 from the first level detecting unit 202 is lower than that of the second detection voltage DET_VOL2 from the second level detecting unit 212.

As a result, the first target level of the first voltage detecting unit 200 having the first level detecting unit 202 is lower in absolute value than the second target level of the second voltage detecting unit 210 having the second level detecting unit 212. For example, when the first target level of the first voltage detecting unit 200 is −0.8V, the second target level of the second voltage detecting unit 210 is −1.0.

The second level changing unit 214 includes a second logic level discriminating unit 214A and a level shifting unit 214B. The second logic level discriminating unit 214A logically discriminates a level of the second detection voltage DET_VOL2 based on a predetermined logic level using the flat voltage VCORE_BB and the ground voltage VSS. The level shifting unit 214B receives an output signal of the second logic level discriminating unit 214A which swings between the flat voltage VCORE_BB and the ground voltage VSS and outputs a signal, as the second detection signal VBB_DET2, which swings between the power supply voltage VDD and the ground voltage VSS.

The second logic level discriminating unit 214A of the second level changing unit 214 includes an eleventh PMOS transistor P11 and a second NMOS transistor N2 which are in series connected to each other between the flat voltage terminal (VCORE_BB) and the ground voltage terminal (VSS). The eleventh PMOS transistor P11 controls the electrical connection of the flat voltage terminal (VCORE_BB) and a middle node (MND2) in response to the voltage level of the second detection signal DET_VOL2 which is applied to a gate thereof. The second NMOS transistor N2 controls the electrical connection of the middle node (MND2) and the ground voltage terminal (VSS) in response to the voltage level of the second detection signal DET_VOL2 which is applied to a gate thereof. That is, the eleventh PMOS transistor P11 and the second NMOS transistor N2 functions as an inverter between the flat voltage terminal (VCORE_BB) and the ground voltage terminal (VSS).

Meanwhile, the level shifting unit 214B of the second level changing unit 214 includes a second inverter INV2 which uses the power supply voltage VDD and the ground voltage VSS and has a structure similar to the second logic level discriminating unit 214A.

Referring to FIG. 3, the voltage level control unit 260 of the back-bias voltage generating circuit according to the invention includes a first control pulse output unit 262, a second control pulse output unit 264, a set/reset latch unit 266, and a voltage driving unit 268.

The first control pulse output unit 262 outputs a first control pulse S_Pulse which is activated for a predetermined section in response to an activation edge (rising edge) of the first detection signal VBB_DET1 from the first voltage detecting unit 200. The second control pulse output unit 264 outputs a second control pulse R_Pulse which is activated for a predetermined section in response to an deactivation edge (falling edge) of the second detection signal VBB_DET2 from the second voltage detecting unit 210. The set/reset latch unit 266 receives the first control pulse S_Pulse through a set input terminal and the second control pulse signal R_Pulse through a reset input terminal, to output a back-bias level control signal VBB_SINK_EN. The voltage driving unit 268 drives the back-bias voltage terminal to the ground voltage terminal (VSS) in response to the back-bias level control signal VBB_SINK_EN.

The first control pulse output unit 262 includes a third inverter INV3, a fourth inverter INV4, a delayer 262A, and a first NAND gate NAND1. The third inverter INV3 inverts the first detection signal VBB_DET1. The fourth inverter INV4 inverts an output signal of the third inverter INV3. The delayer 262A delays an output signal of the fourth inverter INV4 for a predetermined time in order to output a delayed signal which is out of phase with the output signal of the fourth inverter INV4. The first NAND gate NAND1 performs a NAND operation on the output signal of the fourth inverter INV4 and an output signal of the delayer 262A in order to output the first control pulse S_Pulse. Also, the delayer 262A is a delay chain which has an odd number of inverters INV5, INV6, INV7, INV8 and INV9.

The second control pulse output unit 264 includes a tenth inverter INV10, a delayer 264A, and a second NAND gate NAND2. The tenth inverter INV10 inverts the second detection signal VBB_DET2. The delayer 264A delays an output signal of the tenth inverter INV10 for a predetermined time in order to output a delayed signal which is out of phase with the output signal of the tenth inverter INV10. The second NAND gate NAND2 performs a NAND operation on the output signal of the tenth inverter INV10 and an output signal of the delayer 264A in order to output the second control pulse R_Pulse. Also, the delayer 264A is a delay chain which has an odd number of inverters INV11, INV12, INV13, INV14 and INV15.

The set/reset latch unit 266 includes a third NAND gate NAND3 to receive a second feedback signal fb2 and the first control pulse S_Pulse for outputting the back-bias level control signal VBB_SINK_EN, and a fourth NAND gate NAND4 to receive a first feedback signal fb1, the second control pulse R_Pulse and a reset signal RESET for outputting the second feedback signal fb2. At this time, the back-bias level control signal VBB_SINK_EN functions as the first feedback signal fb1.

The voltage driving unit 268 includes twelfth to fourteenth PMOS transistors P12 to P14 which are in series connected to each other between the ground voltage terminal (VSS) and the back-bias voltage terminal (VBB).

The twelfth PMOS transistor P12 controls the amount of current flowing from the ground voltage terminal (VSS) to a source of the thirteenth PMOS transistor P13 in response to the back-bias level control signal VBB_SINK_EN which is applied to a gate thereof. Also, the thirteenth PMOS transistor P13 controls the amount of current flowing from a drain of the twelfth PMOS transistor P12 to a source of the fourteenth PMOS transistor P14 in response to the back-bias level control signal VBB_SINK_EN which is applied to a gate thereof. Similarly, the fourteenth PMOS transistor P14 controls the amount of current flowing from a drain of the thirteenth PMOS transistor P13 to the back-bias voltage terminal (VBB) in response to the back-bias level control signal VBB_SINK_EN which is applied to a gate thereof.

At this time, it should be noted that the total driving force of the twelfth to fourteenth PMOS transistors P12 to P14, which are switched in response to the back-bias level control signal VBB_SINK_EN, is lower than that of the back-bias charge pumping unit 240.

Further, it should be noted that the total threshold voltage of the twelfth to fourteenth PMOS transistors P12 to P14, which are switched in response to the back-bias level control signal VBB_SINK_EN, is lower in absolute value than the first target level of the first voltage detecting unit 200.

In the operation of the voltage level control unit 260, when the voltage level of the back-bias voltage VBB goes from a lower level to a higher level, compared to the first target level of the first voltage detecting unit 200, the first control pulse S_Pulse is toggled so that the back-bias level control signal VBB_SINK_EN is deactivated. The voltage driving unit 268 is turned off by the deactivation of the back-bias level control signal VBB_SINK_EN.

For example, at the time the voltage level of the back-bias VBB goes from −0.81V to −0.79, that is, at the time the voltage level of the back-bias voltage VBB becomes higher than the first target level (−0.8V), the voltage driving unit 268 is turned off. This means that the voltage driving unit 268 stops the driving operation when the voltage driving unit 268 is driving the back-bias voltage terminal to the ground voltage VSS, and that the voltage driving unit 268 does not carry out any driving operation continuously when the voltage driving unit 268 is not working.

Meanwhile, at the time the voltage level of the back-bias voltage VBB goes from a higher level to a lower level, compared to the second target level of the second voltage detecting unit 210, the second pulse R_Pulse is toggled so that the back-bias level control signal VBB_SINK_EN is activated. The voltage driving unit 268 is turned on by the activation of the back-bias level control signal VBB_SINK_EN.

For example, at the time the voltage level of the back-bias voltage VBB goes from −0.99V to −1.01, that is, at the time the voltage level of the back-bias voltage VBB is lower than the second target level (−1.0V), the voltage driving unit 268 is turned on.

As apparent from the above, in case that the back-bias voltage generating circuit excessively operates in a standby mode of a semiconductor memory device, the voltage level of the back-bias voltage terminal is decreased blow a predetermined voltage level. The back-bias voltage generating circuit in accordance with the present invention detects and drives the voltage level of the back-bias voltage terminal to go back to the predetermined target level. Accordingly, the voltage level of the back-bias voltage terminal is always maintained in a range of the predetermined target level. That is, the variation of the back-bias voltage level is made in a stable range so that a semiconductor memory device is not influenced by the variation of the back-bias voltage level. Therefore, the semiconductor memory device can minimize the channel leakage current generated in a cell transistor, regardless of an active mode or standby mode. Further, the cell retention time of the semiconductor memory device is maximized.

While the invention has been described with respect to the particular embodiments, it will be apparent to those skilled in the art that various changes and modifications may be made without departing from the spirit and scope of the invention as defined in the following claims. For example, the transistor and the logic gates of the embodiment can be change in the locations or the type, based on the polarity of the input signals.

What is claimed is:

1. A semiconductor memory device comprising:

a first voltage detecting unit configured to detect a voltage level of a back-bias voltage terminal based on a first target level to output a first detection signal;

a second voltage detecting unit configured to detect the voltage level of the back-bias voltage terminal based on a second target level to output a second detection signal, wherein the second target level is lower than the first target level;

an oscillator configured to generate an oscillation signal, which is oscillated at a predetermined frequency, in response to the first detection signal;

a charge pumping unit configured to drive the back-bias voltage terminal by performing a charge pumping operation in response to the oscillation signal; and a voltage level control unit configured to control a back-bias voltage of the back-bias voltage terminal to be between the first target level and the second target level in response to the first detection signal and the second detection signal by switching on a connection between the back-bias voltage terminal and a ground voltage.

2. The semiconductor memory device of claim 1, wherein the first voltage detecting unit includes:

a first level detecting unit configured to output a first detection voltage, which fluctuates according to a fluctuation of the back-bias voltage; and a first level shifting unit configured to output the first detection signal, which changes based on a comparison of the first detection voltage and a predetermined logic level.

3. The semiconductor memory device of claim 2, wherein the first level detecting unit includes:

a first resistor connected between a flat voltage terminal and a detection node and having a resistance value determined in response to the ground voltage; and a second resistor connected between the detection node and the ground voltage and having a variable resistance value corresponding to the fluctuation of the back-bias voltage.

4. The semiconductor memory device of claim 2, wherein the first level shifting unit includes:

a logic level discriminating unit configured to logically discriminate a level of the first detection voltage based on the predetermined logic level by using a flat voltage and the ground voltage; and a level shifter configured to convert a signal swing of an output signal of the logic level discriminating unit between the flat voltage and the ground voltage to a signal swing of the first detection signal between an external power supply voltage and the ground voltage.

5. The semiconductor memory device of claim 2, wherein the second voltage detecting unit includes:

a second level detecting unit configured to output a second detection voltage, which fluctuates according to the fluctuation of the back-bias voltage; and a second level shifting unit configured to output the second detection signal, which changes based on a comparison of the second detection voltage and a predetermined logic level.

6. The semiconductor memory device of claim 5, wherein the second level detecting unit includes:

a first resistor connected between a flat voltage terminal and a detection node and having a resistance value determined in response to the ground voltage; and a second resistor connected between the detection node and the ground voltage and having a variable resistance value corresponding to the fluctuation of the back-bias voltage.

7. The semiconductor memory device of claim 5, wherein the second level shifting unit includes:

a logic level discriminating unit configured to logically discriminate a level of the second detection voltage based on the predetermined logic level by using a flat voltage and the ground voltage; and a level shifter configured to convert a signal swing of an output signal of the logic level discriminating unit between the flat voltage and the ground voltage to a signal swing of the second detection signal between an external power supply voltage and the ground voltage.

8. The semiconductor memory device of claim 5, wherein the second detection voltage has a range of fluctuation larger than that of the first detection voltage.

9. The semiconductor memory device of claim 1, wherein the voltage level control unit includes:

a first control pulse output unit configured to output a first control pulse that is activated for a predetermined period in response to an activation edge of the first detection signal;

a second control pulse output unit configured to output a second control pulse that is activated for a predetermined period in response to deactivation edge of the second detection signal;

a set/reset latch unit configured to receive the first control pulse through a set input terminal and the second control pulse signal through a reset input terminal and output a back-bias level control signal; and a voltage driving unit coupled between the back-bias voltage terminal to the ground voltage and configured to switch on in response to the back-bias level control signal.

10. The semiconductor memory device of claim 9, wherein the back-bias level control signal is deactivated according to a toggling of the first control pulse and the voltage driving unit turns off when the back-bias voltage goes from a lower level to a higher level in comparison to the first target level.

11. The semiconductor memory device of claim 9, wherein the back-bias level control signal is activated and the voltage driving unit turns on according to a toggling of the second control pulse when the back-bias voltage goes from a higher level to a lower level in comparison to the second target level.

12. A method of driving a semiconductor memory device, comprising:

generating a first detection signal by detecting a voltage level of a back-bias voltage based on a first target level;

generating a second detection signal by detecting the voltage level of the back-bias voltage based on a second target level, wherein the second target level is lower than the first target level;

driving a terminal for the back-bias voltage to the first target level in response to the first detection signal; and controlling the voltage level of the back-bias voltage to be lower than the first target level but higher than the second target level in response to the first and second detection signals by switching on a connection between the terminal for the back-bias voltage and a ground voltage.

13. The method of claim 12, wherein the generating the first detection signal includes:

outputting a first detection voltage, which fluctuates according to a fluctuation of the back-bias voltage; and outputting the first detection signal, which changes based on a comparison of the first detection voltage and a predetermined logic level.

14. The method of claim 13, wherein the generating the second detection signal includes:

outputting a second detection voltage, which fluctuates according to the fluctuation of the back-bias voltage; and outputting the second detection signal which changes based on a comparison of the second detection voltage and the predetermined logic level.

15. The method of claim 14, wherein the second detection voltage has a range of fluctuation larger that that of the first detection voltage.

16. The method of claim 12 wherein the driving the terminal for the back-bias voltage includes:

outputting an oscillation signal oscillated at a predetermined frequency in response to the first detection signal; and performing a charge pumping operation in response to the oscillation signal.

17. The method of claim 12, wherein the controlling the voltage level of the back-bias voltage includes:

outputting a first control pulse, which is activated for a predetermined period, in response to an activation edge of the first detection signal;

outputting a second control pulse, which is activated for a predetermined period, in response to an deactivation edge of the second detection signal;

deactivating a back-bias level control signal in response to a toggling of the first control pulse;

activating the back-bias level control signal in response to a toggling of the second control pulse; and switching on a connection between the terminal for the back-bias voltage and the ground voltage in response to a back-bias level control signal.

* * * * *